(12) United States Patent
Moschiano et al.

(10) Patent No.: US 7,969,788 B2
(45) Date of Patent: Jun. 28, 2011

(54) CHARGE LOSS COMPENSATION METHODS AND APPARATUS

(75) Inventors: Violante Moschiano, Bacoli (IT); Daniel Elmhurst, Folsom, CA (US); Paul Ruby, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 979 days.

(21) Appl. No.: 11/894,377

(22) Filed: Aug. 21, 2007

(65) Prior Publication Data
US 2009/0052269 A1 Feb. 26, 2009

(51) Int. Cl.
*G11C 11/34* (2006.01)
(52) U.S. Cl. ......... 365/185.24; 365/185.09; 365/185.22; 365/210.11
(58) Field of Classification Search ............. 365/185.02, 365/185.24, 185.09, 185.22, 210.11
See application file for complete search history.

(56) References Cited

U.S. PATENT DOCUMENTS

| | | | | |
|---|---|---|---|---|
| 5,677,869 A * | 10/1997 | Fazio et al. | ............... | 365/185.03 |
| 5,694,356 A * | 12/1997 | Wong et al. | ............... | 365/185.03 |
| 6,538,922 B1 * | 3/2003 | Khalid et al. | ............ | 365/185.03 |
| 6,639,849 B2 * | 10/2003 | Takahashi et al. | ........ | 365/185.03 |
| 7,237,074 B2 * | 6/2007 | Guterman et al. | ............ | 711/156 |
| 7,426,139 B2 * | 9/2008 | Ho et al. | ................... | 365/185.03 |
| 7,450,433 B2 * | 11/2008 | Wan et al. | ................. | 365/185.29 |
| 7,751,246 B2 * | 7/2010 | Moschiano et al. | ..... | 365/185.19 |
| 2007/0183210 A1 | 8/2007 | Choi et al. | | |

* cited by examiner

*Primary Examiner* — Alexander Sofocleous
(74) *Attorney, Agent, or Firm* — Leffert Jay & Polglaze, P.A.

(57) ABSTRACT

Methods and apparatus for compensating for charge loss in memories include tracking a specific block of the main memory array and determining charge loss compensation by comparing pre-cycled and post-cycled mean threshold voltages for the tracking block; or tracking each block of the main memory and determining charge loss and compensation on a block by block basis.

21 Claims, 3 Drawing Sheets

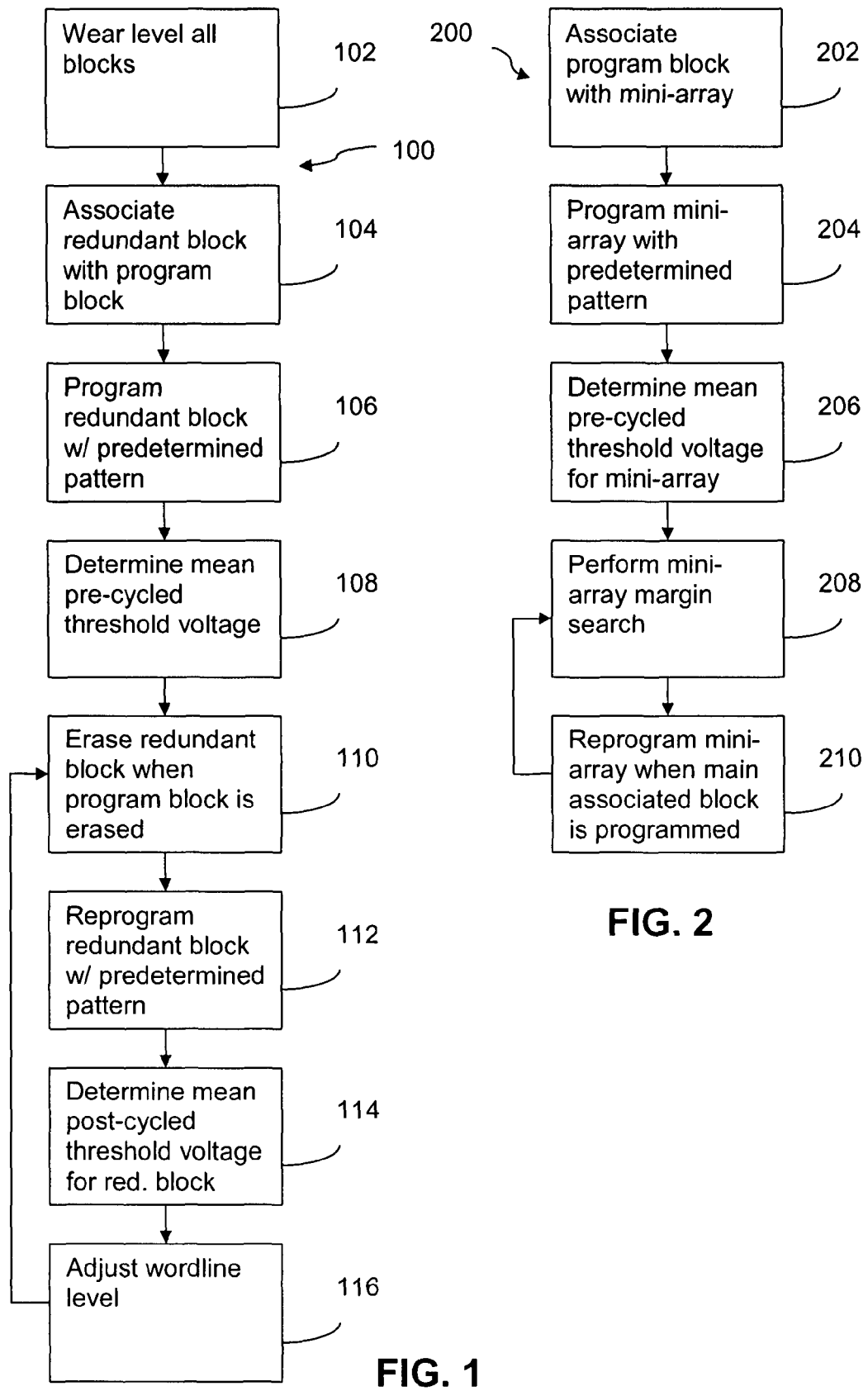

CHARGE LOSS COMPENSATION METHODS AND APPARATUS

FIELD

The present disclosure relates generally to semiconductor memory devices and in particular the present disclosure relates to charge loss in semiconductor memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

As the performance of electronic systems employing flash memory devices increases, flash memory device performance also increases. Performance increases include reducing power consumption, increasing speed, and increasing the memory density. One way to accomplish these tasks is by decreasing the size of the memory array and its individual devices.

In flash memories, electrons are brought on to a floating gate to program the memory, and electrons are removed from the floating gate to erase the memory. This process is well known. Electrons migrate off the gate in several ways without an erase function. This is known as charge loss. Several types of charge loss occur, including intrinsic charge loss, single bit charge loss, and a relatively new phenomenon, quick charge loss. Intrinsic charge loss is the migration of electrons off of a floating gate at a slow rate, typically on the order of millivolts per month. Single cell charge loss is large charge losses off of a very small number of cells in an array. Quick charge loss is significant but measurable charge loss of electrons from the floating gate over a small finite amount of time (i.e., between powering up a part on one tester, placing electrons on the floating gate, and the time a first read is accomplished, that is on the order of half a second to a second). Further, some memories use a process called wear leveling on blocks. Wear leveling is a basic algorithm that makes sure all blocks get programmed and erased the same, that is the same number of times. Program and erase cycles are distributed over all blocks of the memory, so that they all are stressed about the same as opposed to one block getting overly stressed. In wear leveling, once a block, for example block 0, is cycled, all other blocks in the memory are cycled before block 0 is cycled again.

For the reasons stated above, and for other reasons stated below which will become apparent to those skilled in the art upon reading and understanding the present specification, there is a need in the art for improved charge loss compensation in memories.

BRIEF DESCRIPTION OF DRAWINGS

FIG. 1 is a flow chart diagram of a method according to one embodiment of the present invention;

FIG. 2 is a flow chart diagram of a method according to another embodiment of the present invention

DETAILED DESCRIPTION

Figure 3:
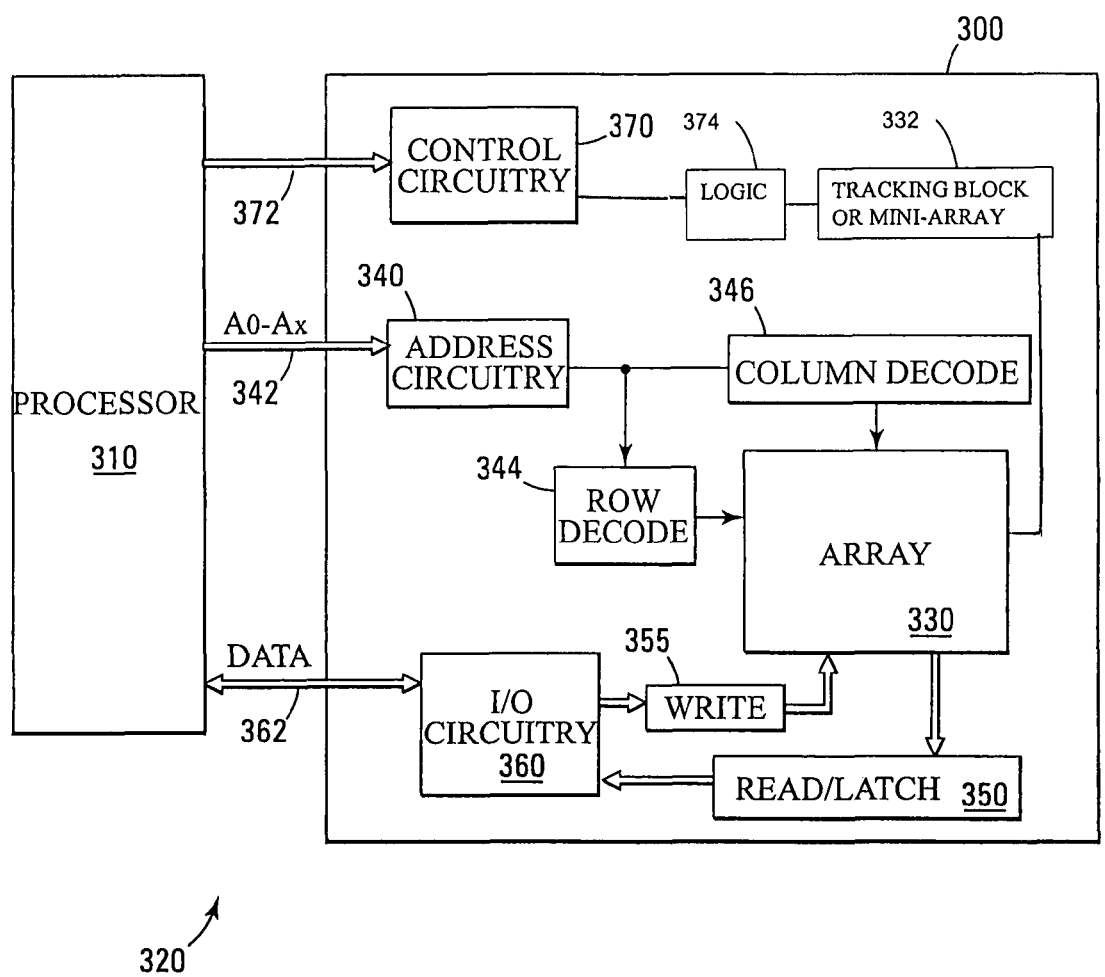
FIG. 3 is a functional block diagram of an electrical system having at least one memory device with a memory array configuration according to one embodiment of the present invention.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

A known phenomenon with flash memories is that when electrons are placed onto the floating gate, they leak off over time with an intrinsic charge loss as described above. Quick charge loss, on the other hand, occurs within a short finite time, about a half second to a second. Compensation for intrinsic charge loss in previous flash memories has used simple cycle counters to determine the number of cycles that a memory has been subject to. Cycle counters do not account for uneven wear on individual blocks, and do not specifically account for charge loss and a shifting threshold voltage. Instead, cycle counters simply adjust the voltage on a verify wordline for an entire memory after a pre-determined number of cycles. In a memory, immediately after initial programming, the cell is considered to be uncycled or pre-cycled, and it has a specific threshold voltage. Once a cell has been cycled, especially a number of times, the threshold voltage on the cell can change due to a number of factors as described above. Cells that have gone through cycling are considered to be post-cycled or cycled.

In the quick charge loss time frame, the portion of electrons that leak in a "quick charge loss" situation can be compensated for by use of the various embodiments described herein.

In one embodiment shown in FIG. 1, a method 100 for compensating for quick charge loss in a memory is shown. Method 100 comprises wear leveling all program blocks in the memory in block 102, associating a redundant block in the memory with one of the program blocks in the memory in block 104, and programming the redundant block in accordance with a specific pattern in block 106. A mean uncycled threshold voltage for the redundant block is determined in block 108. On erasing of the program block associated with the redundant block, the redundant block is erased in block 110, and reprogrammed in block 112 with the specific pattern when its associated block is programmed. The post-cycled mean threshold voltage for the redundant block is determined in block 114, and to compensate for quick charge loss, for example, a wordline voltage level for the memory is adjusted by an amount equal to the difference between the uncycled mean threshold voltage and the current post-cycled mean threshold voltage in block 116. The process continues wear leveling and erasing and reprogramming the redundant block.

A mean threshold voltage is determined since the mean is the most sensible point to use, namely the "average" cell. When the median of a distribution moves, then any adjustment of the wordline voltage applies to the highest percentage of cells. Individual cells that lose more charge, such as cells with single bit charge loss, cannot be compensated without handicapping cells that do not lose as much charge. One way to determine a mean is through a binary or margin search of all the threshold voltages of the block, page, or portion of the memory that is to have its mean determined. Since the distribution curves of threshold voltage in cells in a block, page, or section of a memory are generally close to symmetric (Gaussian), the mean threshold voltage value is very close to the median threshold voltage, and the terms are used interchangeably.

In the embodiment 100, one block is dedicated to be a tracking block. The tracking block is a redundant block. At testing, a page or multiple pages are programmed at a set threshold voltage level, and then a binary search is performed to determine a mean threshold voltage of the page, block, or distribution. When a cell or group of cells are programmed in accordance with a particular data pattern, the average uncycled cell in the group of cells should have a particular threshold voltage right out of the fabrication process. With a distribution of all 0,0 programmed cells, a mean threshold voltage of for example, 2.5 volts, is determined. As program and erase cycles are performed, the average threshold voltage for the block leaks down over time either by quick charge loss or over time by intrinsic charge loss. At testing, the initial uncycled threshold voltage mean is measured and stored, so every time the block associated with the redundant tracking block is erased, the redundant block is also erased, and when the associated main array block is programmed, the tracking block or page on the tracking block is also programmed in accordance with the same specific pattern with a known uncycled mean threshold voltage. Then, the difference between the current post-cycled threshold voltage mean for the tracking block is compared to the uncycled threshold voltage mean, and a correction factor determined by the difference in the uncycled threshold mean and the current post-cycled threshold voltage mean is applied to compensate for quick charge loss.

In another embodiment 200 shown in FIG. 2, another method for compensating for charge loss is shown. Method 200 compensates not only for quick charge loss but also for intrinsic charge loss. This embodiment uses a tracking block that is a mini-array. In this embodiment, a mini-array is a smaller group of cells than an entire block such as is used in method 100 that can be more easily segmented, and can be accessed faster than a full block. Faster access allows compensation on a block by block level as opposed to wear leveling on all blocks. Charge loss and detection applications using mini-arrays do not require wear leveling on all blocks, so the logic or other controller function necessary for wear leveling is not needed in the mini-array embodiments of the present invention. Small mini-arrays are capable of fast reads and thus are capable of charge loss detection and adjustment applications not using wear leveling, and that can adjust not only for quick charge loss but also for intrinsic charge loss.

Method 200 employs a mini-array which allocates a page or a portion of a page to each block. Each program block has its own profile, as opposed to a single tracking block for each block of the memory as in method 100. This method is more user and controller independent, that is, it more of an on-silicon solution. The compensation is built in to the array. Therefore, there are fewer requirements for a customer or user to create or program a controller to deal with charge loss issues.

In operation, when the main array block is erased, the page of the mini-array associated with the main array block is also erased. When the main array block is programmed, a specific pattern is programmed inside the mini-array (that is to a whole page, or to a portion of a page of the mini-array for each program block). When the main array block associated with a particular mini-array or portion thereof is read, a mini-array margin search is made on the associated mini-array to find the difference between its current post-cycled threshold voltage mean and its pre-cycled threshold voltage mean. Pre-cycled threshold voltage mean is in one embodiment measured when the memory leaves a testing line.

Method 200 comprises associating each program block in the memory with a mini-array or a page or portion of a page of the mini-array in block 202, and programming each respective mini-array or portion thereof with a specific pattern in block 204. In block 206, a mean uncycled threshold voltage is determined for each mini-array or portion thereof. Upon reading of a main array block, a mini-array margin search is completed on its associated mini-array page or portion thereof in block 208 to determine a difference between its current post-cycled threshold voltage mean and its uncycled threshold mean. The mini-array or portion thereof is re-programmed with the specific pattern when its associated block is programmed in block 210, and charge loss is compensated by adjusting a wordline voltage level by an amount equal to a difference between the uncycled mean threshold voltage and a current post-cycled mean threshold voltage for the tracking block.

The difference between the current post-cycled threshold voltage mean and the uncycled threshold voltage mean for the mini-array allows a correction factor as described above to be determined. Based on the difference, the wordline voltage used during a read operation is adjusted to compensate for charge loss. Since each block is represented by an associated mini-array or portion thereof that is programmed contemporaneously to the block, both quick charge loss and intrinsic charge loss are compensated in the embodiments of method 200. Intrinsic charge loss is very time dependent per block, but since the mini-array and the associated main array block are programmed at essentially the same time, intrinsic charge loss is compensated automatically. Since there is a dedicated mini-array or portion thereof for each block, then each block and its associated mini-array effectively lose mean charge at the same rate. Therefore, a fast read allows measurement of data, so both quick charge loss and intrinsic charge loss are calculated and adjusted at the same time. The read word line is compensated as data is read.

The mini-array embodiments of method 200 take up more real estate on a memory than the redundant tracking block embodiments of method 100, on the order of as much as 32 times bigger than using a redundant tracking block. That is, mini-array embodiments use as much as 32 blocks of mini-arrays out of 4096 main array blocks, instead of one redundant block per 4096 main array blocks. However, the use of mini-arrays allows each block of the main array to be individually addressed with respect to wear. This block by block tracking allows better adjustment on a block by block basis.

Method 200 is applied in another embodiment in program verify operations to adjust program verify wordline value to compensate for quick charge loss. In this embodiment, a program operation is followed nearly immediately by a verify operation, so quick charge loss compensation can be performed. For example, when a block has been programmed and erased even 100 times, its quick charge loss may be 100 mV after a half second, but its intrinsic charge loss may be much smaller.

Each of the methods described above are also employable at a system level. In such an embodiment, the methods are performed by a controller or processor, instead of on the chip level. In these embodiments, the chip outputs appropriate information such as the pre-cycled mean threshold voltage and the current post-cycled mean threshold voltage, and the controller or processor calculates appropriate adjustment and applies that adjustment. Instead of using circuitry on the chip, the function is the same but is run by the controller or processor.

Memory devices and systems employing the embodiments described above are shown in greater detail in FIGS. 3 and 4.

FIG. 3 is a functional block diagram of a memory device 300, such as a flash memory device, of one embodiment of the present invention, which is coupled to a processor 310. The memory device 300 and the processor 310 may form part of an electronic system 320. The memory device 300 has been simplified to focus on features of the memory that are helpful in understanding the present invention. The memory device includes an array of memory cells 330 having a redundant tracking block or a series of mini-arrays 332 performing the functions described above and shown in FIGS. 1 and 2. The memory array 330 is arranged in banks of rows and columns.

An address buffer circuit 340 is provided to latch address signals provided on address input connections A0-Ax 342. Address signals are received and decoded by row decoder 344 and a column decoder 346 to access the memory array 330. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 330 by sensing voltage or current changes in the memory array columns using sense/latch circuitry 350. The sense/latch circuitry, in one embodiment, is coupled to read and latch a row of data from the memory array. Data input and output buffer circuitry 360 is included for bi-directional data communication over a plurality of data (DQ) connections 362 with the processor 310, and is connected to write circuitry 355 and read/latch circuitry 350 for performing read and write (also referred to as program) operations on the memory 300.

Command control circuit 370 decodes signals provided on control connections 372 from the processor 310. These signals are used to control the operations on the memory array 330, including data read, data write, and erase operations. On-chip logic 374 is used to control the programming and reading of the redundant block or mini-arrays 332. Alternatively, the redundant tracking block or mini-arrays are controlled by an off-chip controller or processor such as processor 310.

The flash memory device has been simplified to facilitate a basic understanding of the features of the memory. A more detailed understanding of internal circuitry and functions of flash memories are known to those skilled in the art.

Figure 4:
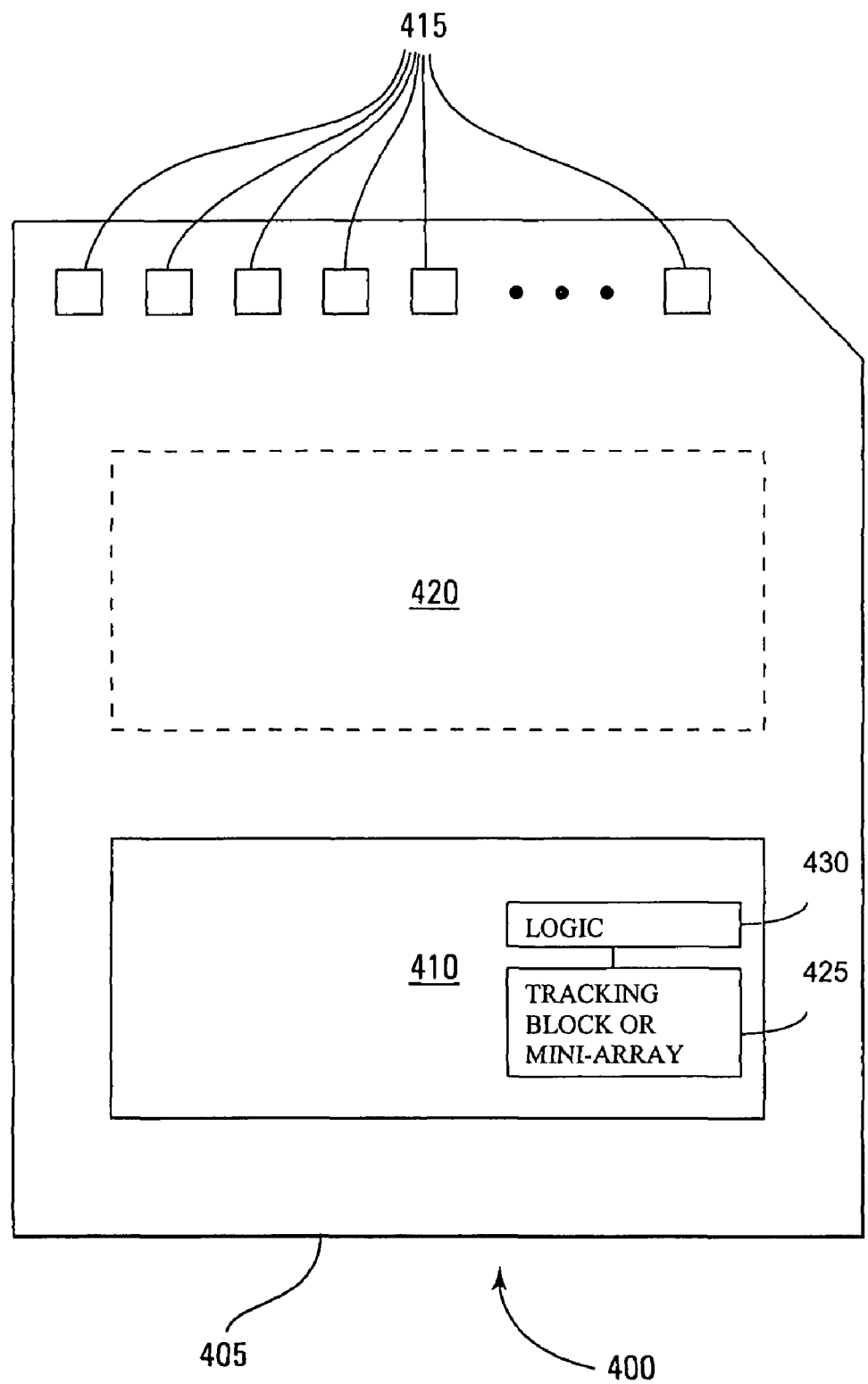
FIG. 4 is functional block diagram of a memory module having at least one memory device in accordance with an embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory including redundant tracking blocks or mini-arrays 425 according to various embodiments of the present invention, controlled by logic 430 if logic is on the module, or alternatively controlled by an off-module controller or processor as described above. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

CONCLUSION

Methods and apparatus for charge loss compensation in memories have been described such as those that include separate redundant or tracking blocks or mini-arrays (or portions thereof) that are associated with program blocks of the memory and which allow determination of charge loss compensation through comparison of an uncycled mean threshold voltage for the tracking block or mini-array and a current post-cycled mean threshold voltage for the tracking block or mini-array when the uncycled and post-cycled tracking blocks or mini-arrays are programmed with the same pattern.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a memory, comprising:
   determining a quick charge loss compensation for at least one block of the memory; and
   adjusting a wordline voltage of the memory according to the quick charge loss compensation;
   wherein determining a quick charge loss compensation comprises:
      programming a tracking block in the memory associated with the at least one block of the memory in accordance with a specific pattern;
      determining a first mean threshold voltage for the tracking block; and
      re-programming the tracking block in accordance with the specific pattern when its associated block is programmed; and
   wherein adjusting the wordline voltage level is based on the first mean threshold voltage and a second mean threshold voltage for the tracking block after the reprogramming.

2. The method of claim 1, wherein determining the quick charge loss compensation comprises:
   wear leveling program blocks in the memory;
   erasing the tracking block when its associated program block is erased.

3. The method of claim 2, wherein adjusting the wordline voltage comprises adjusting the wordline voltage level equal to a difference between the first mean threshold voltage and the second mean threshold voltage for the tracking block after the re-programming.

4. The method of claim 2, wherein the tracking block is programmed as a single redundant memory block for one block of the memory.

5. The method of claim 2, wherein the tracking block is a plurality of mini-arrays, each block of the memory having a separate mini-array or a portion thereof associated therewith.

6. A method of operating a memory, comprising:
   determining a quick charge loss compensation for at least one block of the memory; and
   adjusting a wordline voltage of the memory according to the quick charge loss compensation;
   wherein determining the quick charge loss compensation comprises:
      programming at least a portion of a mini-array in the memory for each of the blocks of the memory in accordance with a specific pattern;
      determining a first mean threshold voltage for the at least a portion of each mini-array;
      determining a difference between a second mean threshold voltage of the at least a portion of the mini-array upon reading a program block associated with the at least a portion of the mini-array and the first mean threshold voltage for the at least a portion of the mini-array; and
      adjusting a wordline voltage level by the difference.

7. The method of claim 6, wherein determining the quick charge loss compensation comprises:
   completing a mini-array margin search on the at least a portion of the mini-array block when its associated main array block is read;
   re-programming the at least a portion of the mini-array in accordance with the specific pattern when its associated block is programmed.

8. The method of claim 7, wherein programming of the at least a portion of a mini-array is contemporaneous to programming of its associated program block.

9. A method of operating a memory, comprising:
   wear leveling program blocks in the memory;
   associating a redundant block in the memory with one of a plurality of program blocks in the memory;
   programming the redundant block in accordance with a specific pattern;
   determining a mean uncycled threshold voltage for the redundant block;
   erasing the redundant block when its associated program block is erased;
   re-programming the redundant block in accordance with the specific pattern when its associated block is programmed;
   determining a current post-cycled mean threshold voltage for the redundant block; and
   adjusting a wordline voltage level based on the mean uncycled threshold voltage and the current post-cycled mean threshold voltage.

10. The method of claim 9, wherein adjusting further comprises raising the wordline voltage level by an amount equal to a difference between the uncycled mean threshold voltage and the current post-cycled mean threshold voltage for the redundant block.

11. A method of operating a memory, comprising:
    associating each program block in the memory with at least a portion of a mini-array;
    programming each respective at least a portion of a mini-array in accordance with a specific pattern;
    determining a mean uncycled threshold voltage for each at least a portion of a mini-array;
    completing a mini-array margin search on the at least a portion of a mini-array block when its associated program block is read to determine a difference between its current post-cycled threshold voltage mean and the mean uncycled threshold voltage for the at least a portion of the mini-array;
    re-programming the at least a portion of the mini-array in accordance with the specific pattern when its associated block is programmed; and
    adjusting a wordline voltage level by an amount equal to the difference.

12. The method of claim 11, wherein associating with at least a portion of a mini-array comprises allocating a page or a portion of a page of a mini-array to each program block.

13. A method of operating a memory, comprising:
determining an uncycled mean threshold voltage for a tracking block of the memory programmed in accordance with a specific pattern;
storing the uncycled mean threshold voltage for the tracking block;
monitoring the erasing of one of a plurality of memory blocks in the memory;
erasing the tracking block every time the monitored one of the plurality of memory blocks is erased;
re-programming the tracking block in accordance with the specific pattern;
determining a current post-cycled mean threshold voltage level for the tracking block;
determining a correction voltage based on the stored uncycled mean threshold voltage and the current post-cycled mean threshold voltage level; and
adding the correction voltage to a program verify level for verification.

14. The method of claim 13, wherein determining the correction voltage comprises subtracting the current post-cycled mean threshold voltage from the stored uncycled mean threshold voltage.

15. A memory device, comprising:
an array of non-volatile memory cells, having a plurality of program blocks;
a tracking block associated with one of the program blocks, the tracking block to store a mean threshold voltage to allow determination of quick charge loss compensation for the associated program block; and
logic circuitry on the memory to compare an original mean threshold voltage of the tracking block to the mean threshold voltage to determine the quick charge loss compensation.

16. A memory device, comprising:
an array of non-volatile memory cells, having a plurality of main program array blocks, arranged in rows and columns;
control circuitry to read, write and erase the memory cells;
address circuitry to latch address signals provided on address input connections;
a plurality of mini-arrays, a mini-array or a portion thereof associated with one of the main program array blocks, each mini-array or portion thereof to store current post-cycled mean threshold voltage of its associated main program array block to allow determination of charge loss compensation for its main program array block; and
logic circuitry on the memory to compare an uncycled mean threshold voltage of each mini-array or portion thereof to the current post-cycled mean threshold voltage to determine the charge loss compensation for its main program array block.

17. The memory device of claim 16, wherein each mini-array comprises a plurality of blocks.

18. A memory device, comprising:
an array of non-volatile memory cells, having a plurality of program blocks and a tracking block;
logic circuitry to compare an original mean threshold voltage of the tracking block to a mean threshold voltage;
circuitry for control and/or access of the array of non-volatile memory cells, the control circuitry adapted to perform a method comprising:
determining a quick charge loss compensation for at least one program block based on the original mean threshold voltage and the mean threshold voltage; and
adjusting a wordline voltage of the memory for read operations by an amount equal to the quick charge loss compensation.

19. A memory device, comprising:
an array of non-volatile memory cells, having a plurality of program blocks and a tracking block, the memory cells accessed by bitlines and word lines; and
circuitry for control and/or access of the array of non-volatile memory cells, the control circuitry adapted to perform a method comprising:
wear leveling program blocks in the memory;
associating a redundant block in the memory with one of a plurality of program blocks in the memory;
programming the redundant block in accordance with a specific pattern;
determining a mean uncycled threshold voltage for the redundant block;
erasing the redundant block when its associated program block is erased;
re-programming the redundant block in accordance with the specific pattern when its associated block is programmed;
determining a difference between the mean uncycled threshold voltage and a current mean threshold voltage for the redundant block; and
adjusting a wordline voltage level by the difference.

20. A memory device, comprising:
an array of non-volatile memory cells, having a plurality of program blocks and a tracking block, the memory cells accessed by bitlines and word lines; and
circuitry for control and/or access of the array of non-volatile memory cells, the control circuitry adapted to perform a method comprising:
associating each program block in the memory with a mini-array or a portion thereof;
programming each respective mini-array or portion thereof with a specific pattern;
determining a mean uncycled threshold voltage for each mini-array or portion thereof;
completing a mini-array margin search on a mini-array block or portion thereof when its associated main array block is read to determine a difference between a current mean threshold voltage of the mini-array block or portion thereof and the uncycled mean for the mini-array or portion thereof;
re-programming the mini-array with the specific pattern when its associated block is programmed; and
adjusting a wordline voltage by an amount equal to the difference.

21. A system, comprising:
a processor; and
one or more memory device coupled to the processor, wherein at least one of the memory devices comprises:
an array of non-volatile memory cells;
a tracking block; and
logic circuitry to compare an original mean threshold voltage of the tracking block to a mean threshold voltage;
circuitry for control and/or access of the array of non-volatile memory cells, the control circuitry adapted to perform a method comprising:
determining a quick charge loss compensation for at least one block of the memory based on the original mean threshold voltage and the mean threshold voltage; and
adjusting a wordline voltage of the memory according to the quick charge loss compensation.

* * * * *